United States Patent [19]
Huhndorff et al.

[11] Patent Number: 5,494,496
[45] Date of Patent: Feb. 27, 1996

[54] BATTERY VOLTAGE TESTER FOR END OF CELL

[75] Inventors: Harry R. Huhndorff, Bay Village; John C. Bailey, Columbia Station, both of Ohio

[73] Assignee: Eveready Battery Company, Inc., St. Louis, Mich.

[21] Appl. No.: 435,625

[22] Filed: May 5, 1995

Related U.S. Application Data

[63] Continuation of Ser. No. 90,805, Jul. 12, 1993, Pat. No. 5,418,085, which is a continuation-in-part of Ser. No. 648,069, Jan. 31, 1991, abandoned.

[51] Int. Cl.⁶ .................................................. H01M 6/00
[52] U.S. Cl. ............................................................. 29/623.5
[58] Field of Search ............................ 29/623.1, 623.5; 324/435, 104; 429/90–93

[56] References Cited

U.S. PATENT DOCUMENTS

| | | | |
|---|---|---|---|
| 394,100 | 12/1888 | Currie | 429/93 |
| 1,497,388 | 6/1924 | Sterling . | |
| 2,988,590 | 6/1961 | Andre | 429/93 |
| 3,667,039 | 5/1972 | Garfein et al. | 324/92 |
| 3,720,869 | 3/1973 | Rowlette | 429/93 |
| 4,248,942 | 2/1981 | Eby et al. | 429/93 |
| 4,497,881 | 2/1985 | Bertolino | 429/91 |
| 4,702,563 | 10/1987 | Parker | 350/351 |
| 4,702,564 | 10/1987 | Parker | 350/351 |
| 4,723,656 | 2/1988 | Kiernan et al. | 206/333 |
| 4,726,661 | 2/1988 | Parker | 350/351 |
| 4,737,020 | 4/1988 | Parker | 350/351 |
| 4,801,514 | 1/1989 | Will et al. | 429/167 |
| 4,835,475 | 5/1989 | Hanakura et al. | 324/435 |
| 4,835,476 | 5/1989 | Kurosawa | 324/435 |
| 4,902,108 | 2/1990 | Byker | 350/357 |
| 4,911,994 | 3/1990 | Will et al. | 429/167 |
| 5,015,544 | 5/1991 | Burroughs et al. | 429/93 |
| 5,059,895 | 10/1991 | Cataldi et al. | 324/104 |

FOREIGN PATENT DOCUMENTS

| | | |
|---|---|---|
| 63-179269 | 7/1988 | Japan . |
| 63-213256 | 9/1988 | Japan . |
| 2441365 | 3/1990 | Japan . |
| 2100269 | 4/1990 | Japan . |
| 2011698 | 7/1979 | United Kingdom . |
| WO92/03852 | 3/1992 | WIPO . |

OTHER PUBLICATIONS

Webster's New Collegiate Dictionary (1979), G. & C. Merriam Co., p. 595.

Primary Examiner—Anthony Skapars
Attorney, Agent, or Firm—Robert W. Welsh

[57] ABSTRACT

A battery is provided with an end-of-cell voltage indicating device which can be used to indicate the state-of-charge of the battery. The indicating device has a flexible substrate of the same peripheral configuration as the battery. The substrate has an indicating coating on one surface which is in thermal or electrical contact with a conductive circuit pattern which can be temporarily connected between the terminals of the battery on application of pressure to an indicated spot on the surface of the substrate. The conductive circuit means causes the indicating coating to undergo a visible change which is representative of the state-of-charge or voltage of the battery. A dual end-switched, integral battery and state-of-charge indicating device having two switches disposed on one end of the battery is also disclosed.

14 Claims, 6 Drawing Sheets

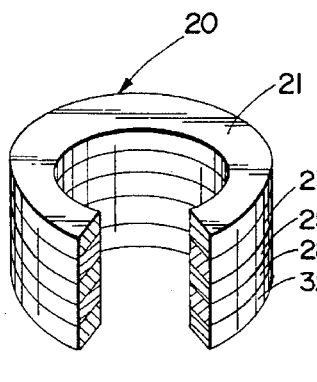
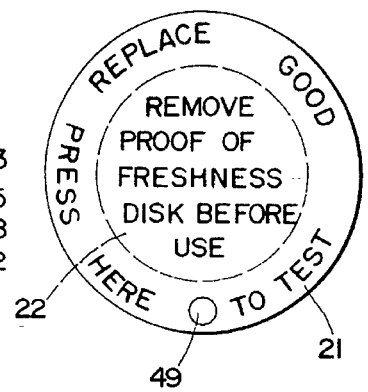
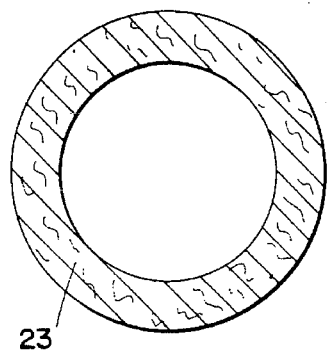
Fig. 1      Fig. 2      Fig. 3
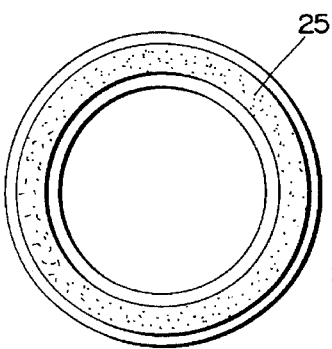
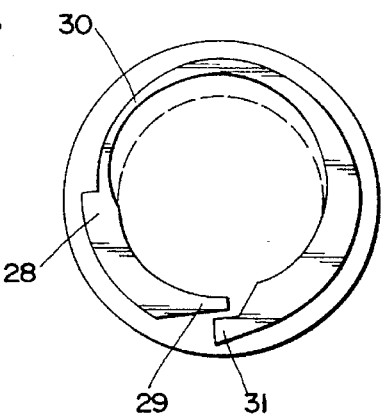
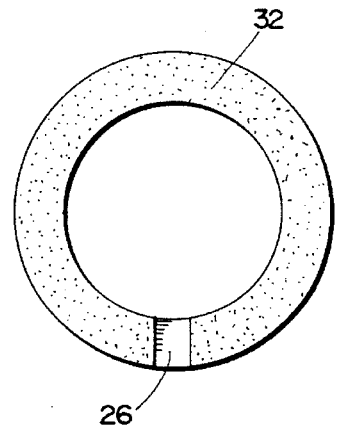
Fig. 4      Fig. 5      Fig. 6
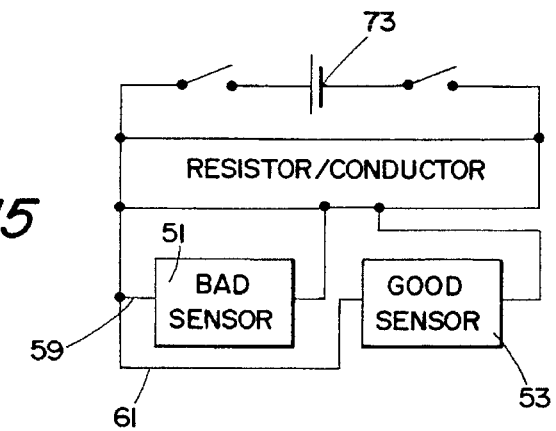
Fig. 15

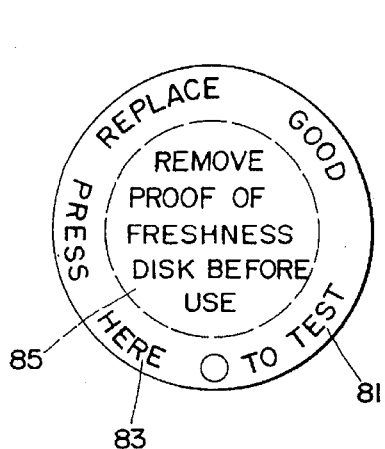
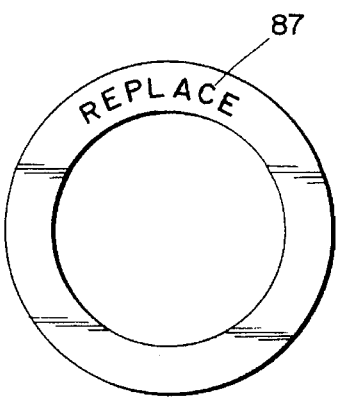
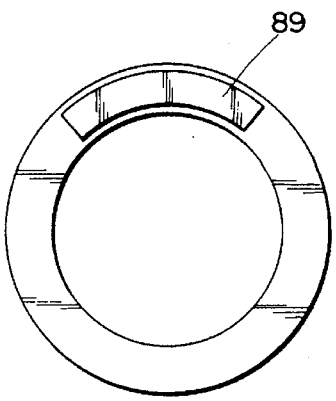
Fig. 16  Fig. 17  Fig. 18
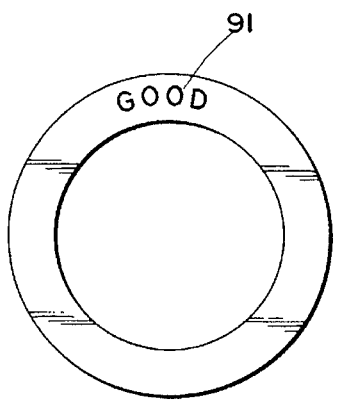
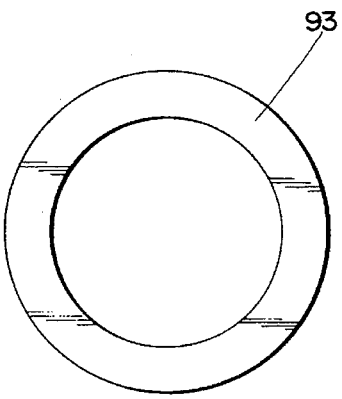
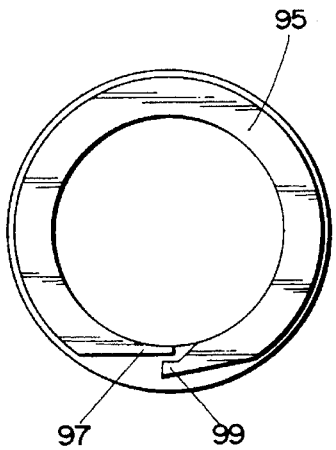
Fig. 19  Fig. 20  Fig. 21
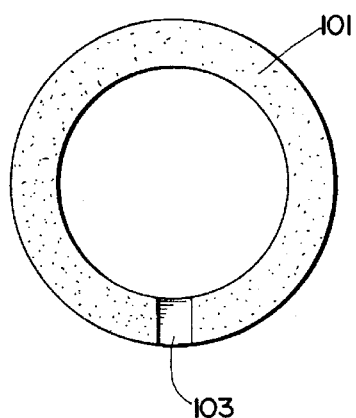
Fig. 22

BATTERY VOLTAGE TESTER FOR END OF CELL

BACKGROUND OF THE INVENTION

This is a continuation of copending application Ser. No. 08/090,805 filed Jul. 12, 1993, now U.S. Pat. No. 5,418,085 which is a continuation-in-part of application Ser. No. 07/648,069, filed Jan. 31, 1991, now abandoned. Several devices have been developed for testing dry cell batteries to determine the freshness or state-of-charge of the cell. For example, U.S. Pat. No. 4,723,656 issued Feb. 9, 1988, to Kiernan et al. discloses a blister-type package for new batteries with a battery condition indicator built into the blister portion of the package. The blister can be deformed to place the tester across the terminal of a battery to be tested. The tester employs a thermochromic material in combination with a shaped resistive element. The flow of current causes a temperature gradient across the resistive element which in turn causes a color change in the thermochromic material to indicate the state-of-charge of the battery. As mentioned, the tester is associated with the package in which the batteries are purchased. Once the batteries are removed from the package, the package is usually discarded and from then on the state-of-charge of the batteries is indeterminate.

Several patents have been issued to Robert Parker, for example U.S. Pat. Nos. 4,702,563; 4,702,564; 4,726,661 and 4,737,020 which disclose a flexible battery tester which has a conductive circuit pattern associated with a layer of thermochromic material. The flexible member is bent so that the circuit pattern can contact the positive and negative terminals of the battery to be tested and, again, the temperature gradient is observed in the thermochromic material and correlated with the state-of-charge of the battery. All of these testers suffer from the same deficiency in that the tester is a separate element which, in the case of the package, is usually thrown away and, in the case of the Parker patent, can be lost or misplaced. In either event, the state-of-charge of the battery is indeterminate once the testing device is no longer available.

An on-the-cell tester would be more convenient for the user since it would be an integral part of the cell or battery and would not be discarded with the original packaging. Likewise, the on-the-cell tester would not be misplaced.

SUMMARY OF THE INVENTION

An integral battery and state-of-charge indicating device is disclosed with a battery having first and second external terminals of opposite polarity. The state-of-charge indicating device has a flexible member on the battery covering a portion of each of the first and second external terminals. An indicating material is on one surface of the substrate. An electrical conductor is on the flexible member in association with the indicating material and is positioned for electrical contact with the first and second external terminals. Pressure on the flexible member will cause the conductor to complete an electrical circuit between the first and second external terminals on the battery causing the indicating material to change optical absorption to an extent depending on the state-of-charge of the battery.

The indicating material can be a thermochromic material which changes color or becomes transparent. The color can be used to indicate the state of the battery. If the material becomes colorless, a suitable scale underneath the material can be used to indicate the state of the battery. Many suitable thermochromic materials which change color have been disclosed, for example, the materials of U.S. Pat. No. 4,723,656 which issued Feb. 9, 1988, to Kiernan et al., as well as the several materials disclosed in the patents issued to Robert Parker U.S. Pat. Nos. 4,702,563; 4,702,564; 4,726,661 and 4,737,020. All of the above-mentioned patents are incorporated herein by reference.

Electrochromic materials can also be used which change color or optical absorption on the direct application of a DC potential. The electrochromic material can undergo an oxidation/reduction chemical reaction or can be affected by the resulting products produced by the oxidation and reduction of a solvent or another component, for example, ions produced by water on the application of the DC potential. The electrochromic materials can be liquid crystal materials which undergo a change in color on application of a DC field such as those disclosed in U.S. Pat. No. 4,667,039 issued on May 30, 1972, to Garfein et al. which is incorporated herein by reference. The electrochromic material can also be of the type which changes color or optical absorption on the direct application of a DC potential which initiates an oxidation/reduction reaction either in the electrochromic material or in another component or in a solvent in which the electrochromic material is dissolved with the electrochromic material undergoing a change as a result of products of the oxidation and reduction of the solvent or another component. Suitable materials of this type are conventional acid base indicators such as phenolphthalein and methylene blue and also materials of the type disclosed in U.S. Pat. No. 4,902,108 issued Feb. 20, 1990, to Byker which is incorporated herein by reference.

The state-of-charge indicator can be in the form of a washer which is fastened to an end cover of the battery. The washer-like tester can be held in place by an adhesive and/or the battery wrapper which is heat shrunk onto the battery where it covers a portion of the edges of the end covers.

In another embodiment of the present invention, different layers of indicating materials are employed. The layers are activated at different temperatures or states and can be designed to change color and/or turn clear at different temperatures. For example, the layer of material activated at the highest temperature will preferably be the bottom layer, and the upper layers are arranged in decreasing temperature of activation with the lowest temperature material in the top layer. These layers can be arranged so that, when the tester is activated, only the word "GOOD" is visible until the battery state-of-charge has decreased to a certain level, at which point only the word "REPLACE" becomes visible.

In another embodiment of the present invention, a dual end-switched, integral battery and state-of-charge indicating device is utilized. This embodiment has two switches disposed on one end of a battery and a voltage indicator in electrical contact between the two switches. Operation of the tester only occurs when both switches are simultaneously closed.

BRIEF DESCRIPTION OF THE DRAWINGS

FIG. 1 is an enlarged sectional view of the battery voltage tester showing the several layers used to make the tester;

FIG. 2 is a top plan view of a tester as installed on a battery with a removable proof of freshness seal in the center;

FIG. 3 is a plan view of a thermochromic layer used in the voltage tester;

3

Figure 7A:
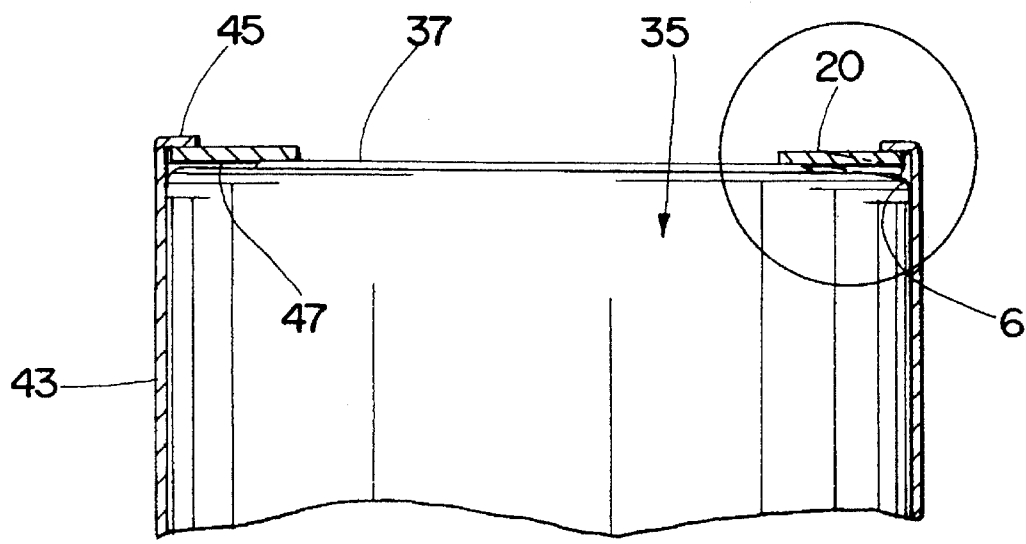
Figure 7B:
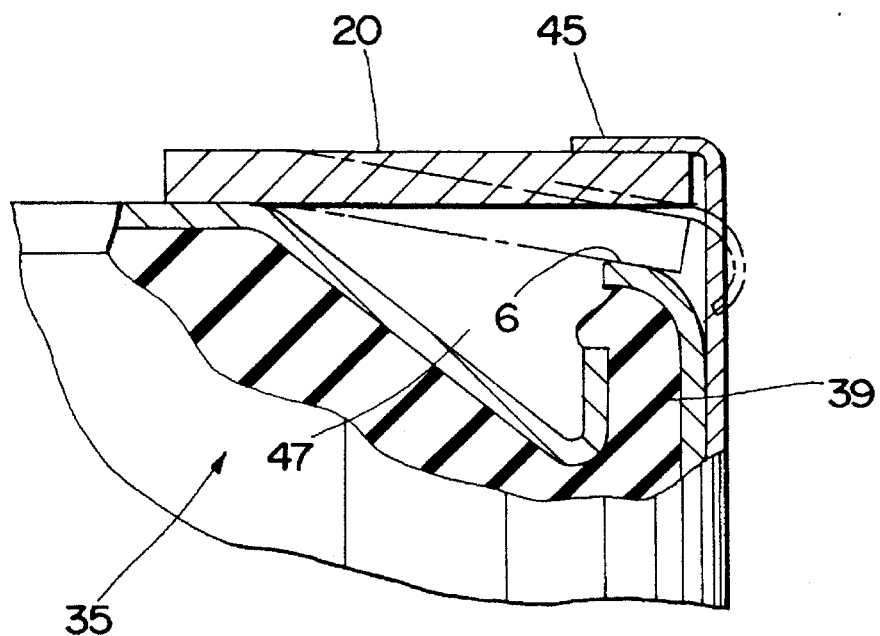
Figures 8, 9, 10:
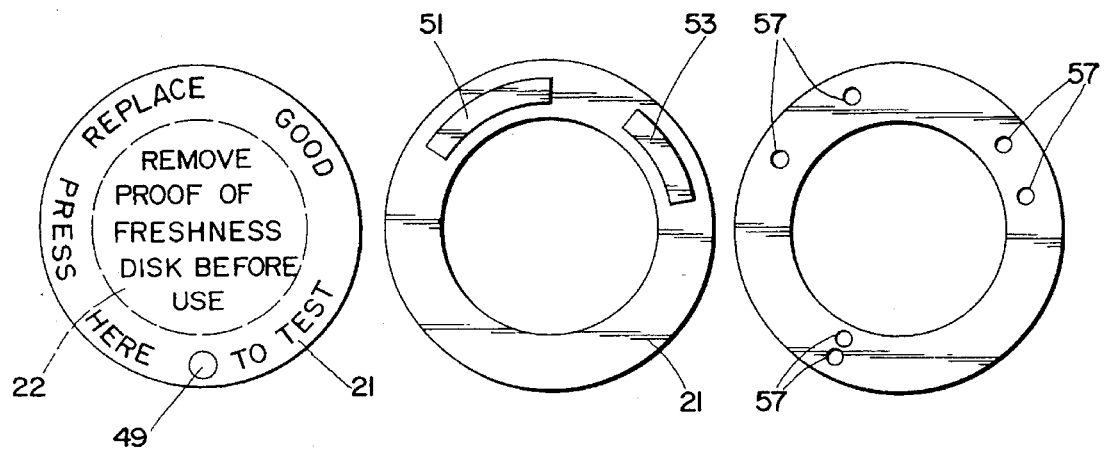
Figures 11, 12, 13:
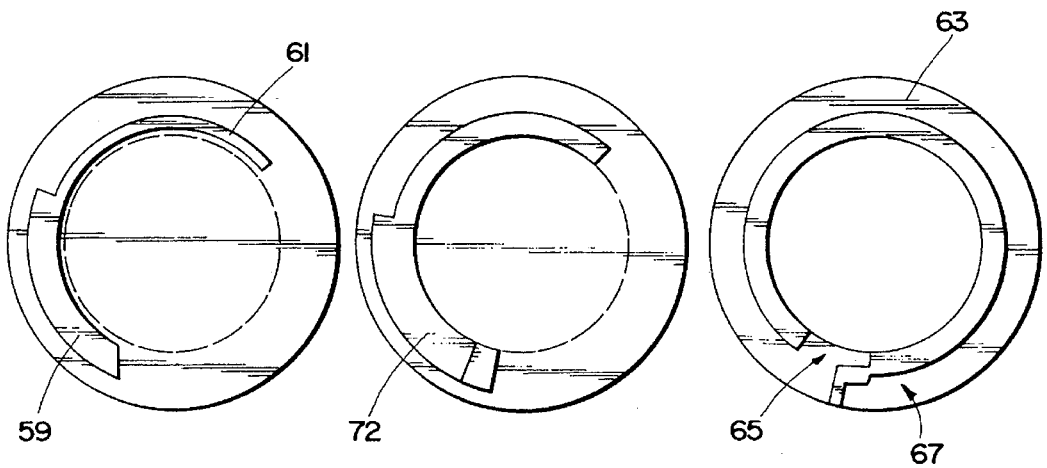
Figure 14:
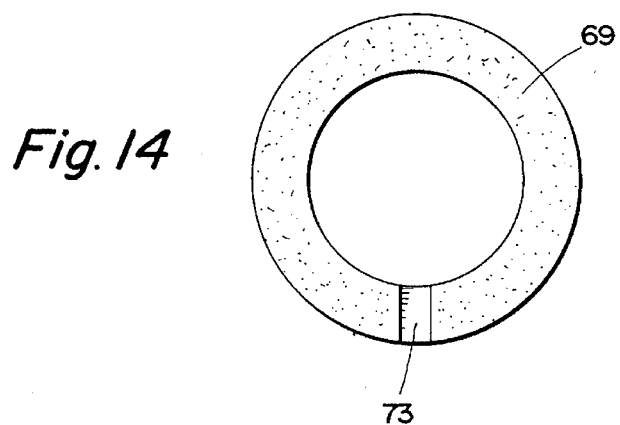
Figure 23:
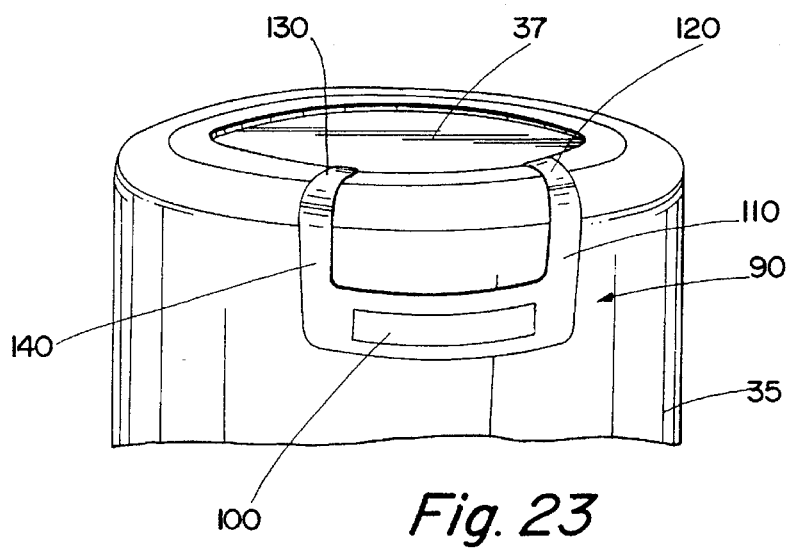
Figure 25:
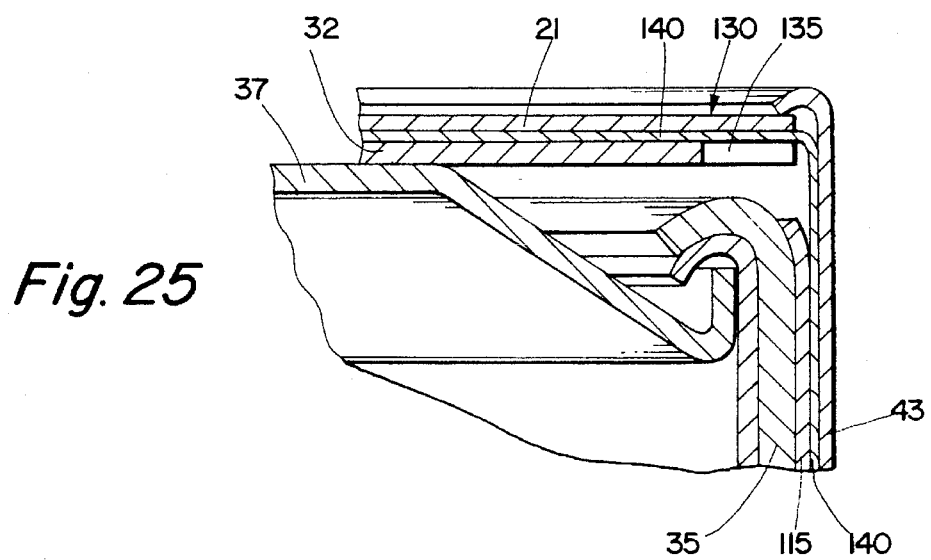
Figure 24:
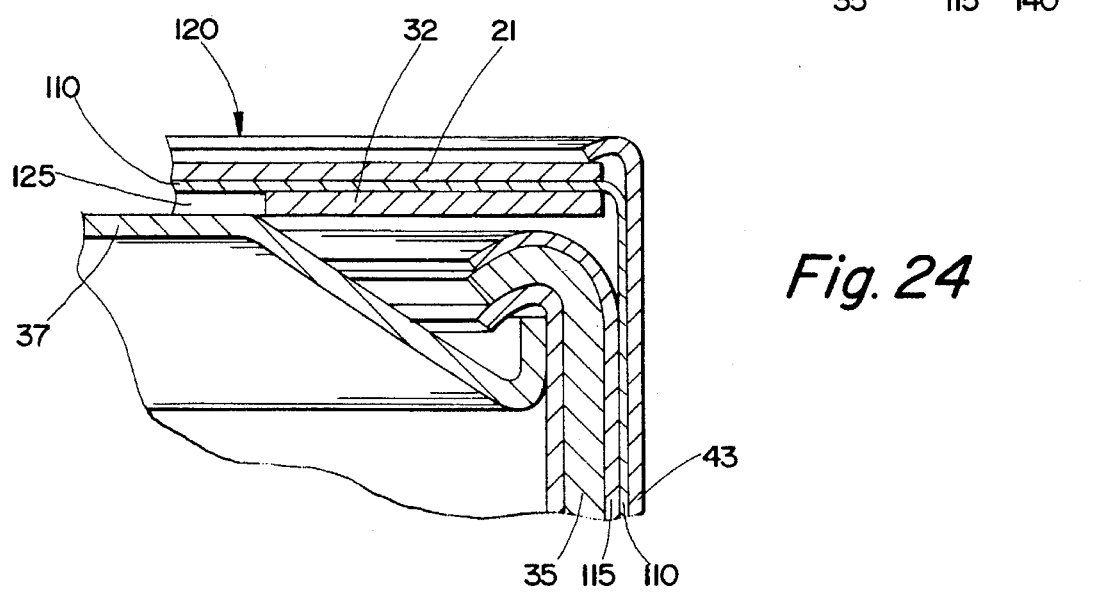
Figure 26:
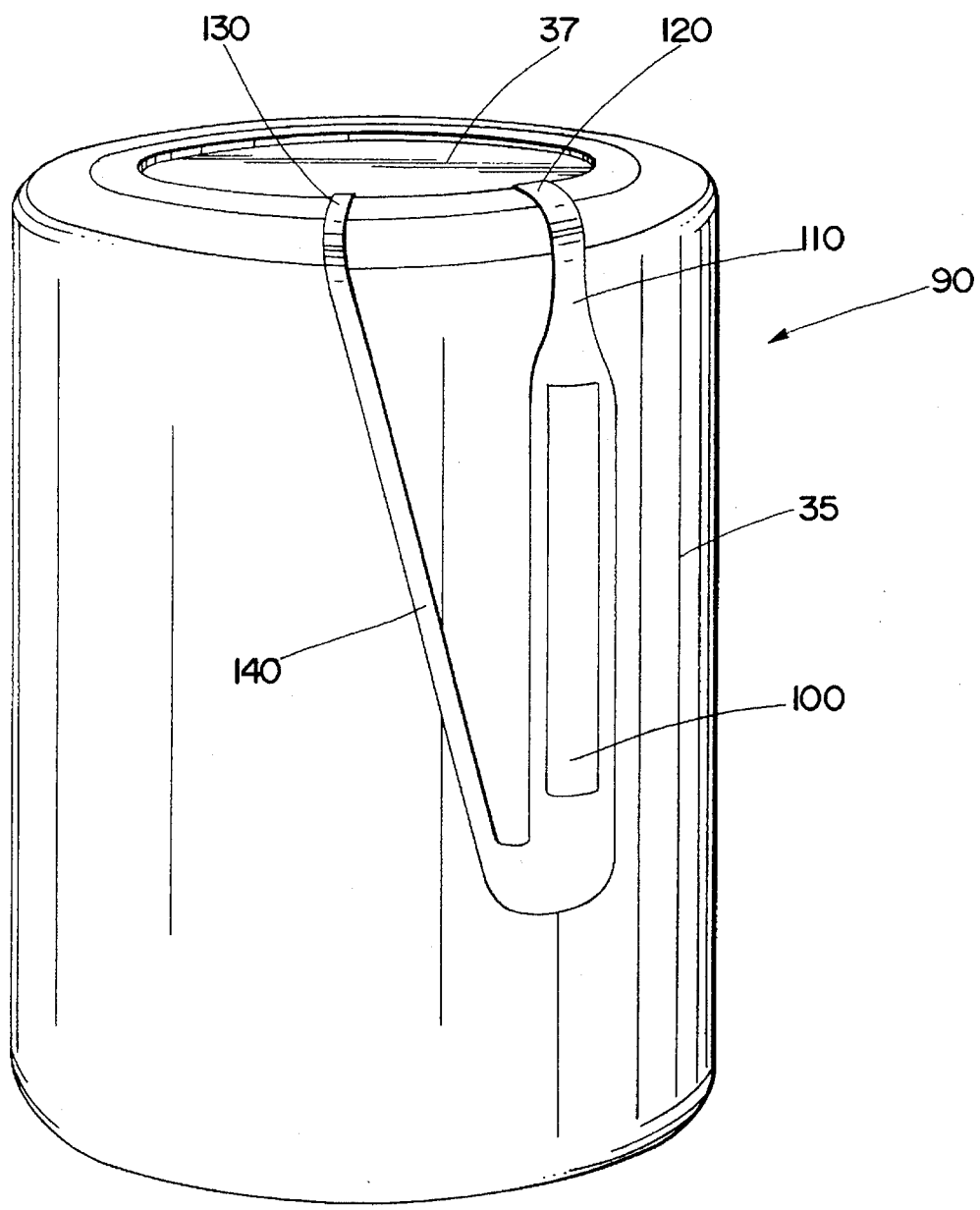

FIG. 4 is a plan view of a color band used in the voltage tester;

FIG. 5 is a plan view of a conductive pattern used in a first embodiment of the voltage tester;

FIG. 6 is a plan view of a layer of insulation used on an embodiment of the voltage tester;

FIG. 7A is a partial schematic view of a battery voltage tester installed on the negative end of a battery;

FIG. 7B is an enlarged view of the structure included within the circle of FIG. 7A;

FIG. 8 is similar to FIG. 2 and shows the base substrate on which the several layers of the voltage tester are supported;

FIG. 9 is a plan view of spaced electrochromic coatings applied to the substrate;

FIG. 10 is a plan view of an insulating layer applied over the layers of FIG. 9;

FIG. 11 is a plan view of the conductive pattern used in a second embodiment of the voltage tester;

FIG. 12 is a plan view of a layer of insulating material on the conductive pattern of FIG. 11;

FIG. 13 is a plan view of a conductive pattern used in the voltage tester;

FIG. 14 is a plan view of an insulation layer used on the second embodiment of the voltage tester;

FIG. 15 is a schematic view of the connection between the cell being tested, the conductive pattern and the good and bad electrochromic sensors;

FIG. 16 is a substrate used in a third embodiment of the present invention with indicia thereon;

FIG. 17 is a word indicative of the state of the battery printed on the substrate;

FIG. 18 is a layer of material used to contrast or highlight the indicative word of FIG. 17;

FIG. 19 is a second word indicative of the state of the battery;

FIG. 20 is a layer of material of contrasting color to highlight the graphics;

FIG. 21 is a resistor/conductor layer having spaced contact portions;

FIG. 22 is a layer of electrical insulating material which covers all but the electrical contact portion of the resistor/conductor layer shown in FIG. 21;

FIG. 23 illustrates a dual end-switched, battery and integral state-of-charge indicator;

FIG. 24 illustrates the configuration of one of the switches of the embodiment depicted in FIG. 23;

FIG. 25 illustrates the configuration of the other switch depicted in FIG. 23; and FIG. 26 illustrates an alternate embodiment of a dual end-switched, battery and integral state-of-charge indicator.

DETAILED DESCRIPTION OF THE PREFERRED EMBODIMENTS

Referring to FIG. 1, a sectional view of the voltage tester, indicated generally by the number 20, is shown which has a substrate 21 which can be made of any flexible polymeric material such as polyethylene, polyester, polypropylene or polyvinyl chloride (PVC). The preferred material is polyvinyl chloride which can be either transparent or translucent so that the change produced in the voltage tester cell can be viewed through the substrate. The several components making up the voltage tester are applied as layers to a surface of the substrate 21. The several layers can be applied by direct printing or silk screen printing techniques and built up in layers on the substrate 21.

The tester can be manufactured in a circular form on a washer sized to fit the battery to be tested and installed on the end of the cell, preferably the bottom, before the label is heat shrunk around the end of the cell. The term "bottom," as used for the cell construction described herein, refers to that end of the cell which is open during assembly and is then closed by an end cover. In the manufacture of the tester, the substrate 21 can be punched out of suitable polymeric material along with a center portion 22 (FIG. 2) which can be used as a proof of freshness seal for the battery. The peripheral edge of the center disc 22 is partially relieved so that it can be easily removed before the battery is put into service.

In the manufacture of the battery voltage tester, it is preferred to use a web of the substrate material which can hold many testers and run the web through a suitable printing machine or coating machine where each layer of the tester can be applied at individual stations. After the several layers have been applied, the web of material can be run through a suitable punch or die cutting operation to separate the individual voltage testers from the web so that the testers can be applied to batteries in the finishing of the cell during the heat shrinking of the label.

The first layer of material to be applied to the substrate depends on the type of materials to be used to indicate the freshness or voltage of the battery. If a thermochromic layer is to be used which becomes transparent upon heating, the layer 23 (FIG. 3) would be applied to the substrate. The next layer to be applied would be the color band 25 (FIG. 4) followed by the conductive pattern indicated generally by the number 28 (FIG. 5). It can be seen in FIG. 5 that the conductive pattern has a pair of spaced end portions 29 and 31 and a shaped pattern 30 which progressively increases in width in a clockwise direction. The next layer to be applied to the voltage tester is a layer of electrical insulation 32 which covers the surface of the layer 28 with the exception of the opening at 26 through which the ends 29 and 31 are exposed. When the tester is installed on the battery, layer 32 faces the battery end cover.

A decolorizing thermochromic layer 23 (FIG. 3) employing a dye material such as crystal violet lactone can be used with a suitable phenolic material and a wax material for forming a film. A decolorizing combination is disclosed in U.S. Pat. No. 4,835,476 issued to Kurosawa on May 30, 1989, the teaching of which is incorporated herein by reference. Employing a material of this type, layer 23 would become transparent on heating and expose the layer 25 of the color band which would be below it. The color band can be made of any suitable printed ink pattern which is chemically compatible with the layer 23. If a thermochromic material is used which generates a color or a visible front on heating, then the layer 25 of FIG. 4 can be eliminated from the voltage tester and the layer 23 can be put in thermal contact with the conductive pattern 28.

The conductive pattern 28 can be a silk screened layer of conductive ink incorporating copper, silver, or other conductive materials. It can also be made of any of the well-known transparent conductive materials such as a doped substoichiometric oxide of tin, indium, cadmium or zinc; however, since the voltage tester is only to be viewed from one side, there is no reason for the conductive pattern to be transparent. The layer 32 can be printed or silk screened over the conductive pattern using a non-conductive ink or varnish or the like, which can be used to electrically insulate all but the contact end portions of the conductive pattern 28.

As mentioned above, after the printing steps are complete, the individual voltage testers can be die stamped from the web of polymeric material and can be applied to the end of a battery.

Referring to FIG. 7A, a portion of a battery, in this instance the bottom, is shown and indicated by the number 35. The negative end cover 37 is insulated from the housing or container of the battery by a suitable insulating material 39, shown in FIG. 7B, leaving an air space 47 between the battery cover 37 and tester 20, the purpose of which will be discussed later. The wafer voltage tester 20 is applied to the end cover of the battery with end portion 29 of the conductive pattern 28 of FIG. 5 either contacting (as shown in FIGS. 7A and 7B) or spaced from contact with negative end cover 37. End portion 31 is spaced from the positive portion 35 of the battery container or housing. When the tester is applied to the battery, a small amount of adhesive (not shown) can be used to hold the assembly in place. The battery label 43 is then applied over the battery with the end portion 45 of the label surrounding and gripping the peripheral edge of the voltage tester 20 to hold it in place on the end of the battery. It is important in the assembly of the voltage tester and battery that the air space 47 be provided below the tester to isolate the heat generated in the conductive pattern from the thermal mass of the battery so that an accurate reading can be obtained.

When the assembly of the voltage tester and battery is complete, referring to FIG. 8, pressure applied at 49 will cause end portion 29 of conductive pattern 28 to come into electrical contact with the negative end cover of the battery while contact 31 of the same conductive pattern comes into contact with the positive portion of the battery housing causing current to flow through the shaped portion 30. The heat generated will cause a temperature gradient from hot to cool, depending on the current, and activate the thermochromic material to reveal the words "REPLACE" and/or "GOOD", depending on the freshness of the battery The extent of the temperature gradient in the thermochromic layer is dependent on the voltage of the battery. If the battery voltage is low, the DC potential may not be high enough to generate sufficient current to create a temperature gradient beyond the word "REPLACE" which indicates that the battery should be discarded.

In another embodiment of the battery tester, an electrochromic material is used which can develop a visible discontinuity, depending on the voltage or state-of-charge of the battery. As shown in FIG. 8, the substrate is similar to that shown in FIG. 2. The same type of transparent or translucent material can be used for the layer 21 with the proof of freshness disc 22 again being removable when the battery is put into service.

Similar to the first embodiment of the present invention, the electrochromic embodiment can be printed or coated in multiple layers on a plastic web substrate and then be die cut or stamped out at the end of the manufacturing process. The completed battery testers can then be used in the finishing process in the battery manufacture. For example, a web of polymeric material 21 can be fed through a multiple position printing machine where, at the first printing station, the graphics are printed in reverse. In the next printing station, two or more electrochromic layers, such as 51 and 53, which can be of the same or different electrochromic characteristics, can be applied.

The next layer of material to be applied to the voltage tester is a layer of electrical insulation 55 which has a plurality of spaced apertures 57 therein which provide access to the ends of the electrochromic deposits 51 and 53 for their respective electrical connections. Next, a conductive pattern is applied consisting of two parts 59 and 61. Conductive pattern 61 is substantially longer than conductive pattern 59 and extends in a clockwise direction around the substrate, as shown in FIG. 11. A layer of electrical insulating material 72 is then applied over substantially all of conductive patterns 59 and 61 (FIG. 12). As pointed out above, the conductive patterns 59 and 61 are in electrical contact with one end of each of the electrochromic layers 51 and 53.

The next layer to be applied to the voltage tester is shown in FIG. 13 and is a resistor/conductor pattern 63, having a first end portion 65 and a second end portion 67. The resistor/conductor material 63 can be any type of suitable conductor material such as a metallized layer or preferably a conductive ink, such as an ink containing carbon black, which can be applied through printing. The end portion 65 of the resistor/conductor pattern 63 is in electrical contact with the exposed ends of conductive patterns 59 and 61. The resistor/conductor portion 63 is then covered by a layer of insulation 69 (FIG. 14) except in the area 73 where the insulating pattern leaves the end portions 65 and 67 of the resistor layer 63 exposed. This completes the assembly of the electrochromic voltage tester. The testers can now be die cut or stamped from the web of polymeric material and sent to the battery finishing area where the tester 20 can be applied to the end of the battery, as shown in FIG. 7A and B.

Referring to FIG. 15, a simplified schematic of the voltage tester is shown as it would be connected across a cell 73. The conductive patterns 59 and 61 and the electrochromic layers 51 and 53 are electrically connected through the spaced apertures 57 in the insulation layer 55 shown in FIG. 10. When the switches are closed, connecting the voltage tester to both terminals of the battery, a good battery will produce enough voltage to turn on both the good and bad sensors. A weak battery will only have enough potential to turn on the bad sensor.

In another embodiment of the battery tester, referring to FIGS. 16–22, two or more layers of thermochromic inks are printed on top of one another so that when one or more of the thermochromic layers are activated, the successive layers turn clear, exposing the printed message below. As shown in FIG. 16, the battery tester is indicated generally by the number 80. The first stage of a multi-stage printing operation involves printing the polymeric material 81 with the graphics 83 showing where to "press to test." As in the other embodiments, a removable proof of freshness seal 85 is included.

The second stage of the printing operation involves reverse printing with thermochromic ink an indicative word 87 (FIG. 17) to indicate that the battery is too weak to pass the test when the tester is energized, and should be replaced.

The third stage of the printing operation involves printing a color band 89 with thermochromic ink (FIG. 18) to contrast the indicative word.

The fourth stage of the printing operation prints the word 91 indicating a good battery (FIG. 19).

The fifth stage of the printing operation involves printing a contrasting color 93 to highlight the graphics (FIG. 20).

In the sixth stage of the printing operation, an electrically conductive pattern 95 (FIG. 21) is printed. The resistor/ conductor pattern 95 is similar to the resistor/conductor pattern 63 shown in FIG. 13. Resistor/conductor pattern 95 has spaced contact portions 97 and 99.

In the seventh and final stage of the printing operation, an electrical insulating pattern 101 (FIG. 22) is printed which prevents contact with the battery bottom cover except for the switch area of the resistor/conductor 95 where the contact portions 97 and 99 are exposed through the space 103 in electrically insulating layer 101. If the battery is good, then the resistor/conductor 95 in FIG. 21 will rise to a temperature high enough to cause the thermochromic inks to turn clear showing the message in FIG. 19.

In this embodiment, a temperature gradient along the resistor/conductor is not needed and, in fact, is undesirable because the temperature reached by the resistor/conductor will cause a change in the color of the thermochromic material to indicate directly the state-of-charge of the battery. A temperature gradient in this embodiment will cause only a partial color change, thereby confusing the consumer.

A preferred voltage tester useful in this invention is continually attached to an end cover of a battery container which serves as one terminal. The tester can be applied to either the positive or the negative terminal of the battery.

FIGS. 23–25 illustrate an alternate embodiment of an integral battery and state-of-charge indicator having dual end switches disposed on one end of the battery. The dual end-switched tester, 90 depicted in FIG. 23 is activated by applying pressure simultaneously to switches 120 and 130 to allow current to flow through the tester. The dual end-switched tester 90 is much less susceptible to accidental or unintentional activation than a single switch tester since the dual end-switched tester requires simultaneous closure of both switches to activate the tester.

Tester 90 comprises switches 120 and 130 formed in a flexible member having a wafer structure described below, an indicator 100 for indicating the state-of-charge of the battery, and electrical conductors 110 and 140 for connecting in series indicator 100 with switches 120 and 130. Dual end-switched tester 90, is generally similar to tester 20 previously described herein, except that the indicator is not part of the circular wafer structure. Instead, indicator 100 is preferably disposed together with portions of electrical conductors 110 and 140 on the side of the battery. FIGS. 24 and 25 illustrate the flexible member as comprising a layer of electrical insulation 32 generally disposed over a portion of negative end cover 37 of the battery. Above insulation layer 32 is substrate 21. Situated between layers 32 and 21 are portions of electrical conductors 110 and 140. Electrical conductors 110 and 140 extend from the end of the cell and preferably radially outward from the wafer structure for providing electrical connection to indicator 100. Preferably, electrical conductors 110 and 140 are further disposed between label 43 and insulator 115. More preferably, label 43, conductors 110 and 140, and insulator 115 are affixed to the exterior of battery can 35. Insulator 115 and insulative layer 32 may be of one piece with suitable openings provided for the switches. Conductors 110 and 140, insulator 115 and label 43 may all be part of a multilaminate label construction.

FIG. 24 illustrates the configuration of switch 120 which provides for electrical contact to the negative terminal of the battery. Switch 120 is formed by providing an opening 125 in insulative layer 32 of the wafer structure. By exposing electrical conductor 110 over a region of battery negative end cover 37, closure of switch 120 may be accomplished by applying pressure at switch 120 so that electrical conductor 110 contacts negative end cover 37. Substrate 21 may be an extension of label 43 rather than a separate member as shown in FIG. 24.

Switch 130, illustrated in FIG. 25, provides for electrical contact with battery can 35 which in turn is in electrical connection with the positive terminal of the battery. Switch 130 is formed by providing opening 135 in insulative layer 32 of the wafer structure. By exposing electrical conductor 140 over a region of battery can 35, closure of switch 130 may be accomplished by applying pressure at switch 130 so that electrical conductor 140 contacts positive battery can 35.

Indicator 100, illustrated in FIG. 23 is preferably affixed or secured to the side of the battery or may be an integral part of the battery label. Indicator 100 may be any type of voltage or state-of-charge indicator. Examples include thermochromic indicators or electrochromic indicators as described herein.

Voltage indicator 100 may be oriented in a variety of positions on the battery side. FIG. 26 illustrates an alternate embodiment of the dual end-switched tester in which indicator 100 is oriented along the axial dimension of the battery. This orientation may be preferable in some instances where it would be undesirable to require the indicator to flex along its length to a curved exterior of the battery side.

Though the invention has been described with respect to a specific preferred embodiment thereof, many variations and modifications will become apparent to those skilled in the art. It is therefore the intention that the appended claims be interpreted as broadly as possible in view of the prior act to include all such variations and modifications.

The embodiments of the invention in which an exclusive property or privilege is claimed are defined as follows:

1. A method of producing an integral battery and state-of-charge indicating device, said method comprising:

providing a layer of transparent substrate material;

depositing a layer of thermochromic material on said substrate material;

depositing a conductive pattern having a first end and a second end on said thermochromic material;

depositing a layer of electrical insulation on said conductive pattern whereby said layer of electrical insulation covers substantially all of said conductive pattern except for said first end and said second end of said conductive pattern to form said state-of-charge indicating device;

providing a battery having a first battery end, a second battery end, and an outer surface extending between said first battery end and said second battery end, and a first terminal and a second terminal of opposite polarity;

affixing said state-of-charge indicating device on one of said first battery end and said second battery end such that (i) said layer of electrical insulation faces said end of said battery to which said device is affixed, (ii) said first end of said conductive pattern is either contacting said first terminal or spaced from and adapted to be placed in contact with said first terminal, and (iii) said second end of said conductive pattern is either contacting said second terminal or spaced from and adapted to be placed in contact with said second terminal.

2. The method of claim 1 further comprising:

providing a battery label having an end portion extending along at least a portion of the perimeter of said label;

applying said battery label to at least a portion of said battery outer surface such that said end portion of said label is disposed over the peripheral edge of said state-of-charge indicating device thereby securing and retaining said device affixed to said one of said first battery end and said second battery end.

3. The method of claim 2 wherein said battery label is formed from a heat shrink material, and said method further comprising:

heating said battery label to induce shrinkage of said heat shrink material on said battery.

4. The method of claim 1 wherein said state-of-charge indicating device has a circular, wafer-like form.

5. The method of claim 1 wherein said thermochromic material is a decolorizing thermochromic material, said method further comprising:

depositing a color layer on said layer of decolorizing thermochromic material prior to depositing said conductive pattern.

6. The method of claim 5 wherein said state-of-charge indicating device has a circular, wafer-like form.

7. The method of claim 1, said method further comprising:

depositing a second layer of thermochromic material on the first layer of said thermochromic material prior to depositing said conductive pattern, wherein said second layer of thermochromic material has a different activation temperature than said first layer of thermochromic material.

8. A method of producing an integral battery and state-of-charge indicating device, said method comprising:

providing a layer of transparent polymeric material;

depositing a region of electrochromic material having a first end and a second end on said layer of polymeric material;

depositing a first layer of electrical insulation over a portion of said electrochromic material between said first end and said second end of said electrochromic material;

depositing a conductive pattern having a resistive element disposed between a first end portion and a second end portion, on at least a portion of said electrical insulation such that (i) said first end of said electrochromic material is in electrical contact with said first end portion of said conductive pattern and (ii) said second end of said electrochromic material is in electrical contact with said second end portion of said conductive pattern;

depositing a second layer of electrical insulation over said conductive pattern thereby forming said state-of-charge indicating device;

providing a battery having a first battery end and a second battery end, and a first terminal and a second terminal of opposite polarity;

affixing said state-of-charge indicating device on one of said first battery end and said second battery end.

9. The method of claim 8 wherein said state-of-charge indicating device has a circular, wafer-like form.

10. The method of claim 8 further comprising:

providing a battery label having an end portion extending along at least a portion of the perimeter of said label;

applying said battery label to at least a portion of said battery outer surface such that said end portion of said label is disposed over the peripheral edge of said state-of-charge indicating device thereby securing and retaining said device disposed on said one of said first battery end and said second battery end.

11. The method of claim 10 wherein said battery label is formed from a heat shrink material, and said method further comprising:

heating said battery label to induce shrinkage of said heat shrink material on said battery.

12. A method of producing an integral battery and state-of-charge indicating device, said method comprising:

providing a layer of transparent substrate material;

depositing a first region of electrochromic material having a first end and a second end on said layer of substrate material;

depositing a second region of electrochromic material having a first end and a second end on said layer of substrate material, said second region distinct from said first region;

depositing over said first region of said electrochromic material and over said second region of said electrochromic material, a first layer of electrical insulation having a plurality of apertures, whereby a first aperture is disposed over said first end of said first region of said electrochromic material, a second aperture is disposed over said second end of said first region of said electrochromic material, a third aperture is disposed over said first end of said second region of said electrochromic material, and a fourth aperture is disposed over said second end of said second region of said electrochromic material;

depositing a first conductive pattern having a first portion and a second portion significantly longer than said first portion on said first layer of electrical insulation, whereby said first portion of said conductive pattern is disposed over said first aperture and in electrical contact with said first end of said first region of said electrochromic material through said first aperture, and said second portion of said conductive pattern is disposed over said third aperture and in electrical contact with said first end of said second region of said electrochromic material through said third aperture;

depositing a second layer of electrical insulation over said first conductive pattern;

depositing a second conductive pattern on at least one of said first layer of electrical insulation and said second layer of electrical insulation, said second conductive pattern having a first end portion and a second end portion, said first end and said second end separated by a resistor element, whereby said second end portion of said second conductive pattern is in electrical contact with said second end of said first region of said electrochromic material through said second aperture, and said second end portion of said second conductive pattern is also in electrical contact with said second end of said second region of said electrochromic material through said fourth aperture, and said first end portion of said second conductive pattern is in electrical contact with said first portion of said first conductive pattern;

depositing a third layer of electrical insulation over said second conductive pattern except for said first end portion and said second end portion of said second conductive pattern to form said state-of-charge indicating device;

providing a battery having a first battery end, a second battery end, an outer surface extending between said first end and said second end, and a first terminal and a second terminal of opposite polarity;

affixing said state-of-charge indicating device on one of said first battery end and said second battery end such that (i) said third layer of electrical insulation faces said end of said battery to which said device is affixed, (ii) said first end portion of said second conductive pattern is either contacting said first terminal or spaced from and adapted to be placed in contact with said first terminal, and (iii) said second end portion of said second conductive pattern is either contacting said second terminal or spaced from and adapted to be placed in contact with said second terminal.

13. The method of claim 12 wherein said state-of-charge indicating device has a circular, wafer-like form.

14. A method for producing an integral battery and state-of-charge indicating device, said method comprising:

providing a layer of a transparent polymeric material;

printing a first indicia indicating that said battery has a low state of charge, utilizing a first type of thermochromic ink on said layer of polymeric material;

printing a band over said first indicia utilizing a second type of thermochromic ink having an activation temperature different than said first type of thermochromic ink;

printing a second indicia indicating that said battery has a relatively high state of charge on said band;

depositing an electrically conductive pattern over said second indicia, said pattern having a first end and a second end;

depositing a layer of electrical insulation over said conductive pattern such that said electrical insulation does not cover said first end and said second end of said conductive pattern to form said state-of-charge indicating device;

providing a battery having a first battery end, a second battery end, and a first terminal and a second terminal of opposite polarity;

affixing said state-of-charge indicating device on one of said first battery end and said second battery end such that (i) said layer of electrical insulation faces said end of said battery to which said device is affixed, (ii) said first end of said conductive pattern is either contacting said first terminal or spaced from and adapted to be placed in contact with said first terminal, and (iii) said second end of said conductive pattern is either contacting said second terminal or spaced from and adapted to be placed in contact with said second terminal.

* * * * *